United States Patent [19]

Doluca

[11] Patent Number: 5,027,165
[45] Date of Patent: Jun. 25, 1991

[54] BURIED ZENER DIODE

[75] Inventor: Tunc Doluca, San Jose, Calif.

[73] Assignee: Maxim Integrated Products, Sunnyvale, Calif.

[21] Appl. No.: 526,598

[22] Filed: May 22, 1990

[51] Int. Cl.$^5$ .................... H01L 29/90; H01L 27/00; G05F 5/00
[52] U.S. Cl. ......................... 357/13; 357/36; 357/42; 357/48; 323/231
[58] Field of Search ............... 357/13, 42, 36, 48; 323/231

[56] References Cited

U.S. PATENT DOCUMENTS

| 4,071,852 | 1/1978 | Kannam | 357/13 |
| 4,646,114 | 2/1987 | Vinn et al. | 357/13 |
| 4,677,369 | 6/1987 | Bowers et al. | 357/13 |
| 4,766,469 | 8/1988 | Hill | 357/13 |

FOREIGN PATENT DOCUMENTS 61-55974  3/1986  Japan ........................... 357/13

OTHER PUBLICATIONS

"An Ion Implanted Subsurface Monolithic Zener Diode", Lui et al., IEEE Journal of Solid-State Circuits, vol. SC-14, #4, Aug. 1979, pp. 782–784.

*Primary Examiner*—Rolf Hille
*Assistant Examiner*—M. Saadat
*Attorney, Agent, or Firm*—Blakely, Sokoloff, Taylor & Zafman

[57] ABSTRACT

An improved zener diode formed in a semiconductor wafer having a primary surface, the zener diode having a PN junction buried beneath the surface. The diode includes a pair of spaced contacts on the surface, the first located on one region and the second located on another laterally spaced region of the surface, to establish a current path through the diode. A replica device is formed on the same wafer generally replicating the physical dimensions of the zener diode. The replica device has a pair of spaced surface contacts located on spaced regions of the surface with a replica current path between them having substantially the same resistance as the on-resistance of the current path of the diode, the replica current path replicating the current path except that it has no PN junction. The zener and the replica device are coupled together in a manner so that the voltage across the replica device will be subtracted from the voltage across the diode to generate a difference voltage which will be substantially independent of changes in series resistance of the current path of the zener diode due to variations in wafer manufacturing process or in ambient temperature when the diode is being used.

1 Claim, 4 Drawing Sheets

BURIED ZENER DIODE

BACKGROUND AND FIELD OF THE INVENTION

This invention relates to an improved buried zener diode, in particular one providing minimal adverse consequences caused by series resistances.

Parasitic series resistances in the terminals have plagued buried zener diodes which limit the performance of the device. The fact that the zener diode is buried beneath the surface of the wafer increases these series resistances. Furthermore, these resistance values and temperature coefficients can vary from device to device according to process variations. These values and temperature coefficients are also affected by variations in power supply voltages, causing further unpredictable changes in the series resistances.

One prior art way to overcome the series resistance problem is by reducing the current through the diode. The less the current, the less the undesirable voltage changes which result from these series resistances. However, low current results in higher zener noise, an undesirable side effect.

A buried zener diode of the prior art is shown in FIGS. 1 and 2. The undesirable series resistances $R_1$ and $R_2$ lie between the N+ region 10 and the P+ region 11. When current is passed through the device, voltage drops through the series resistance and results in the voltage between the terminals 10 and 11 being different from the actual intrinsic breakdown voltage of the zener diode.

One way used in the prior art to reduce the effects of these voltage drops is called a "force-sense buried zener". This type of zener, shown in FIGS. 3 and 4, employs three terminals, an N+ terminal 13, a P+ sense terminal 14 and a force terminal 15. The primary current flow is between force terminal 15 and terminal 13, while the high resistance path flows to sense terminal 14 to minimize the adverse effects of the series resistance. However, even in this solution, there is still some resistive coupling between force terminal 15 and sense terminal 14, so the effects of the series resistances are not completely eliminated.

In applications where very low noise, low temperature drift and high power supply rejection is required, but where there are likely to be changes in the series resistances caused by process variations or temperature changes, these prior art solutions are insufficient. This invention provides a buried zener diode where the disadvantage created by these series resistances is almost completely eliminated.

Briefly, the improved zener diode of this invention comprises a semiconductor wafer having a primary surface and a zener diode having a PN junction buried beneath that surface. A pair of spaced P+/N+ contacts for the diode are located on the surface of the wafer, the first located on a first region of the surface and the second located on a second region of the surface laterally spaced from the first, the contacts establishing a current path through the diode across the PN junction.

The device of the invention also employs what is termed a "replica device", formed in the same semiconductor wafer, which generally replicates the physical dimensions of the zener diode. The replica device has a pair of spaced surface contacts with a replica current path between them having substantially the same on-resistance as the current path of the zener, the replica current path replicating the current path through the zener except that it has no PN junction in the current path.

Finally, the diode of the invention has a means coupling the replica device with the diode in a manner such that the voltage across the replica device is subtracted from the voltage across the diode to generate a difference voltage whereby, when current is simultaneously passed through the diode and the replica device, this difference voltage will be substantially independent of changes in the series resistance of the anode/cathode current path of the diode caused by variations in the wafer manufacturing process and by changes in the ambient temperature or applied voltage at which the diode is being used.

DETAILED DESCRIPTION OF THE INVENTION

Figure 1:
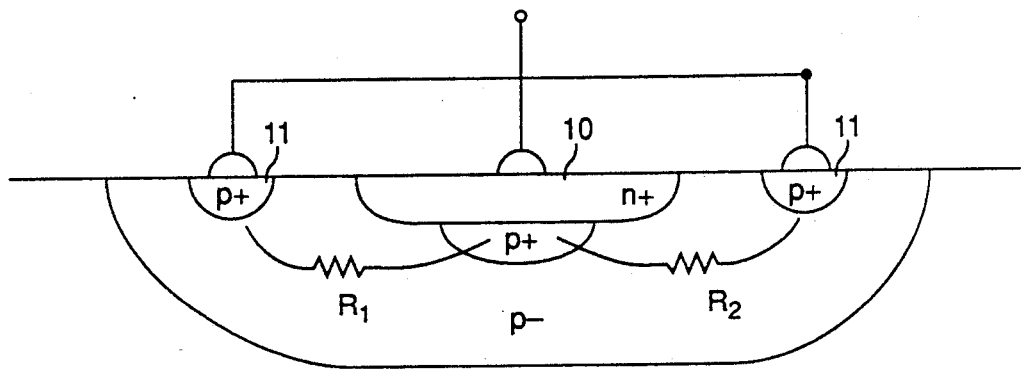
FIG. 1 is a cross-sectional view of a buried zener diode of the prior art.
Figure 2:
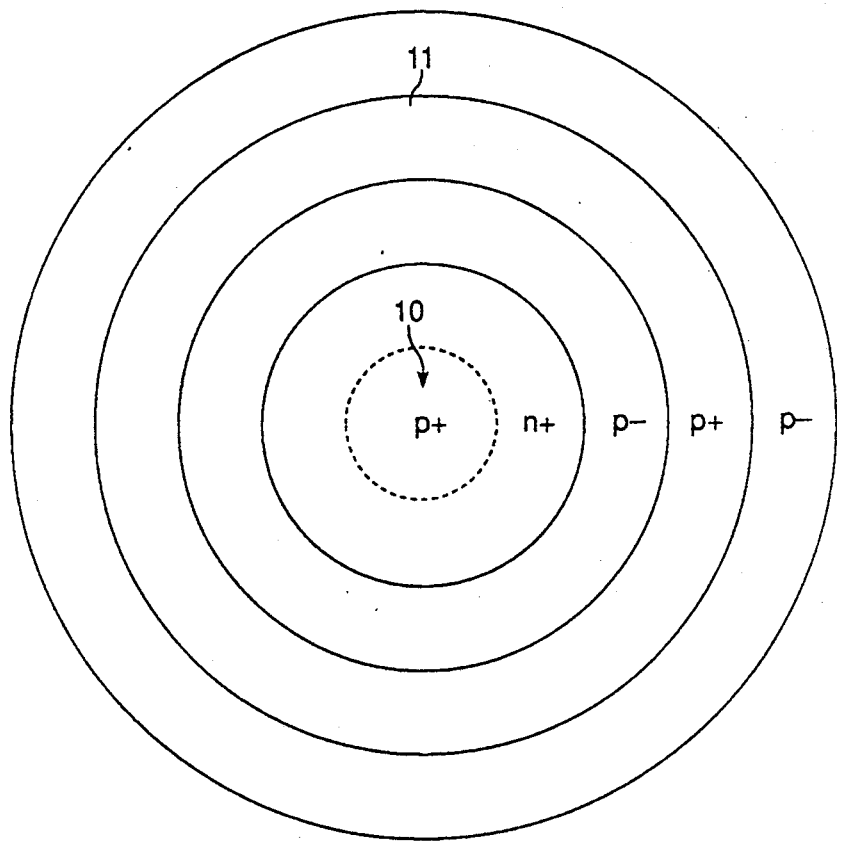
FIG. 2 is a top, plan view of the prior art zener diode shown in cross-section in FIG. 1.
Figure 3:
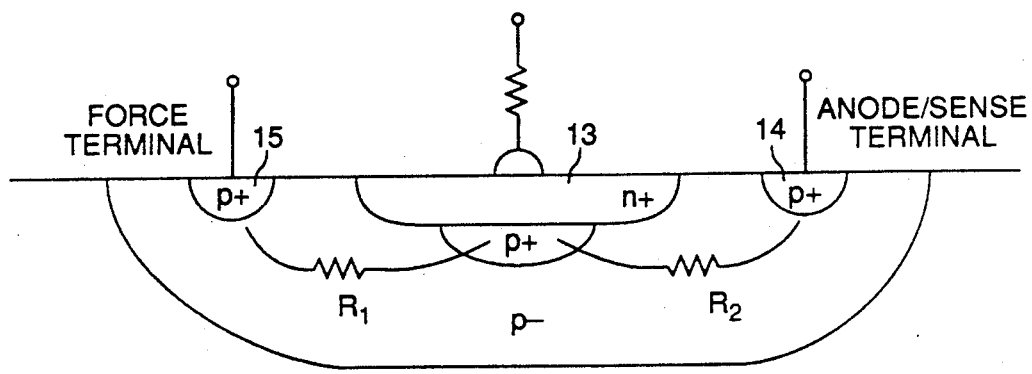
FIG. 3 is a cross-sectional view of another buried zener diode of the prior art.
Figure 4:
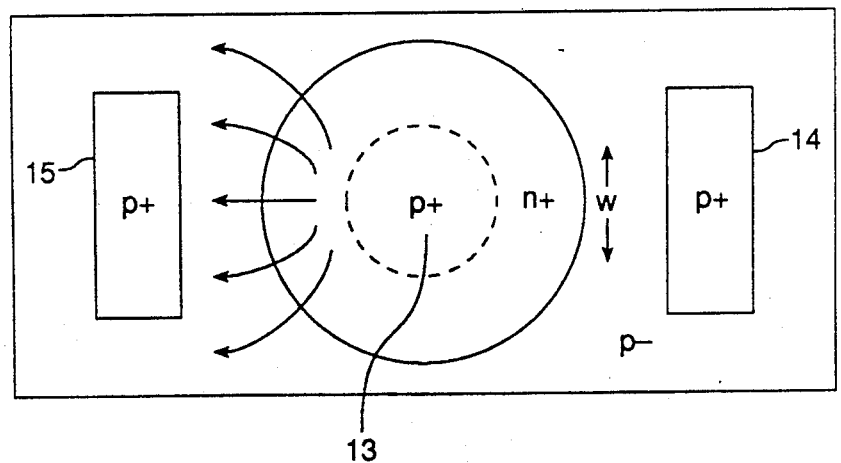
FIG. 4 is a top, plan view of the prior art zener diode shown in cross-section in FIG. 3.
Figure 5:
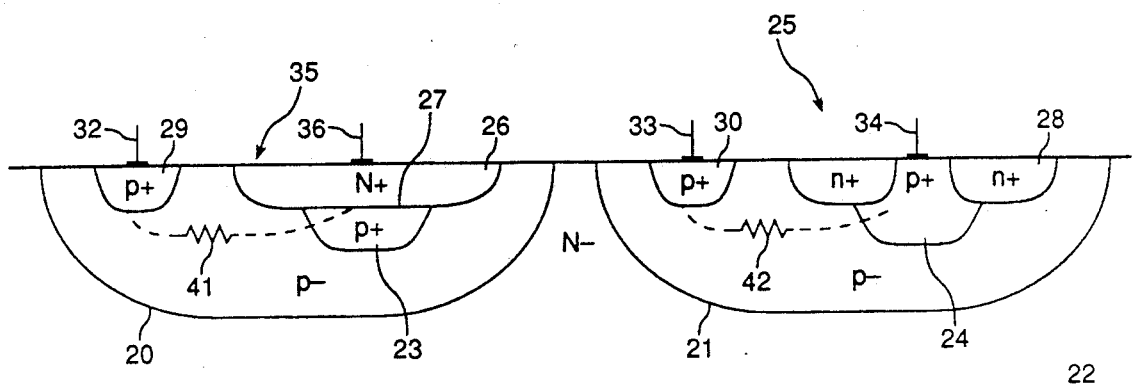
FIG. 5 is a cross-sectional view of the buried zener diode and replica device of the invention.
Figure 6:
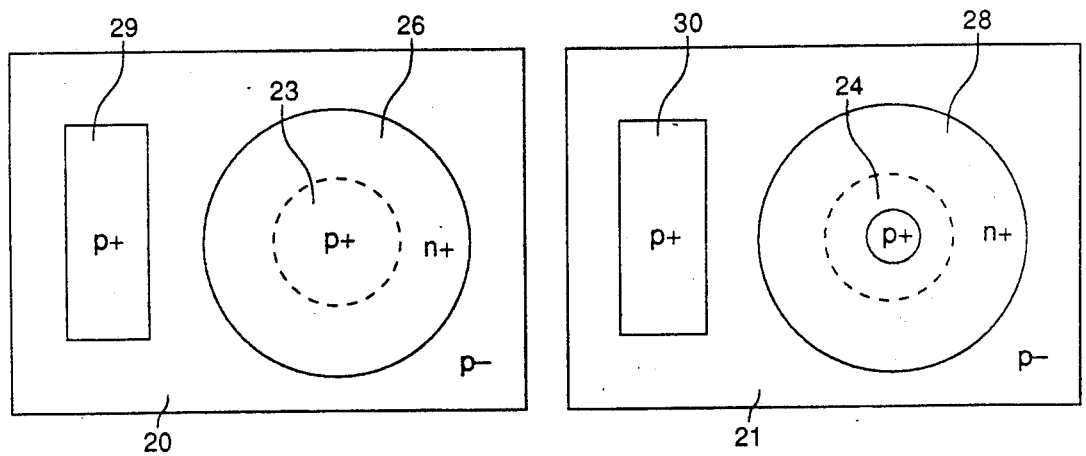
FIG. 6 is a top, plan view of the circuit of the invention shown in FIG. 5.

Referring to FIGS. 5 and 6, the construction of the buried zener diode and replica device of the invention will be explained. Using conventional CMOS technology, the high resistivity P— wells 20 and 21 are formed in silicon semiconductor substrate 22. In the preferred embodiment, substrate 22 is N—type, high resistivity material, as indicated by the "N—" designation. P—type wells 20 an 21 also are high resistivity material as indicated by the "P—" designation. P+ region 23 for the buried zener diode 35 and P+ region 24 for the replica device 25 are formed at the same time by the diffusion or implantation of P—type impurities into the wafer. N+ region 26 of the buried zener diode, forming the buried PN junction 27 with P+ region 23, is formed by diffusion or implantation of impurities, preferably simultaneously with the formation of N+ region 28 which surrounds P+ region 24 of replica device 25.

At the time it is originally formed, N+ region 28 of the replica device, which may be a single doughnut shaped region which surrounds region 24, has the same lateral dimensions and looks very much like N+ region 26 of zener diode 35. During the formation of N+ regions 26 and 28, a mask is employed covering the surface of the wafer over the replica device at region 24, thereby preventing the diffusion of the N—type impurities into region 24. In the next step, P+ contact regions 29 (for the zener diode), and 30 (for the replica device)

are formed by diffusion or implantation. The heavy concentration of P−type impurities creating low resistivity regions 29 and 30 which allow the attachment of metal contacts 32 and 33, such as aluminum, as is well known in the art. Region 24 of the replica device already is heavily doped, permitting the attachment of a good ohmic contact 34 without additional P−type diffusion or implantation. Ohmic contact 36 is attached to N−type region 26 of the zener.

To operate the buried zener diode 35 and the replica device 25, a current is applied to the zener diode 35 between contacts 32 and 36. To reverse bias the PN junction 27 between regions 23 and 26, as is well known in the art, a positive current is forced into contact 36 so that a negative voltage develops between contacts 32 and 36. The same polarity current is also passed through the replica device between contacts 33 and 34, resulting in a positive voltage being developed between contacts 33 and 34. In the case of zener diode 35, the PN junction 27 becomes reversed biased, operating in the conventional manner. However, since there is no PN junction between contacts 33 and 34 of the replica device, there is no such reverse biasing. Instead, the replica device merely provides a resistive path (shown as resistor 42) between contacts 33 and 34 which, since the geometry of the replica device 25 is a substantial copy of the geometry of the zener diode 35, provides the same resistive path as provided by the zener diode in the forward biased direction between contacts 32 and 36 (shown as resistor 41).

Figure 7:
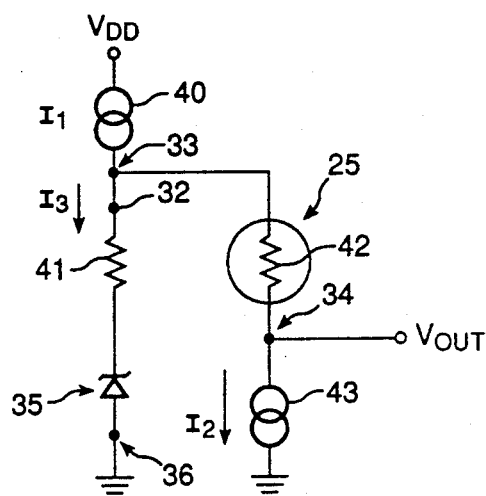
FIG. 7 is a schematic circuit diagram showing the connections between the buried zener diode and the replica device of the invention.

This operation will be better explained referring to the circuit shown in FIG. 7. In FIG. 7, current source 40 supplies current both to zener diode 35 and to replica device 25. The current $I_1$ from current source 40 is divided between current $I_3$ through resistor 41 and zener diode 35, and the current $I_2$ through replica device 25. Resistor 41 represents the series on-resistance between contacts 32 and 36 of the zener diode 35 shown in FIGS. 5, 6 and 7. Resistor 42 of the replica device 25 represents the corresponding resistance between contacts 33 and 34 shown in FIGS. 5, 6 and 7.

Using the circuit of the invention, the replica device 25, having substantially the same physical dimensions as the zener diode 35, provides the same resistance, which tracks the zener series-resistance with process and temperature variations. In the operation of the circuit shown in FIG. 7, the currents to be generated by current sources 40 and 43 are selected so that when the voltage generated across replica device 25 is subtracted from the voltage generated across the on-resistance 41 in the zener path, the difference will be zero. The voltage generated by these two corresponding series-resistances are subtracted from one another so that the output voltage $V_{out}$ shown in FIG. 7 is substantially independent of these resistances. Any drop across them is cancelled out since the two voltages are subtracted from one another, and $V_{out}$ remains equal to the intrinsic zener breakdown voltage from device to device, irrespective of process variations which might otherwise affect these resistors and thus the output voltage $V_{out}$. Moreover, the temperature and power supply variation effects of the current sources on series resistances 41 and 42 also cancel themselves out because they affect both these resistors in exactly the same way.

The use of the circuit of this invention eliminates variations caused by series resistances in zener diode 35. Furthermore, the current through the replica device and the zener diode is independently controlled using current sources 40 and 43 to trim out any slight mismatches between resistors 41 and 42 in the event that these resistances, as formed, are not identically equal. By thus adjusting the current $I_1$, it is possible to achieve precisely zero equivalent resistance.

In the operation of the circuit of FIG. 7, a constant current is applied to the N+ contact of the zener diode through terminal 36. The same current is applied to the replica device through terminal 34. In a preferred embodiment of the invention, the current $I_1$ from current source 40 is 2.3 times the current $I_3$ flowing through zener diode 35. The remainder of the current $I_1$ from source 40 is passed through the replica device 25, and is equal to 1.3 times $I_3$, the current through zener 35. The use of a current ratio different from 1-to-1 may be required because the actual zener diode breakdown occurs at a single point in the central area of PN junction 27 shown in FIGS. 5 and 6, which has a higher resistance than that of the corresponding area of the replica device which, due to photolithography limitations, cannot be confined to a single point. This difference in current restriction causes the series resistance 42 to be slightly lower in the replica device 25 than in the diode 35. To compensate for this limitation, a lower current $I_3$ is used across the diode 35 than the current $I_2$ across the replica device 25.

Figure 8:
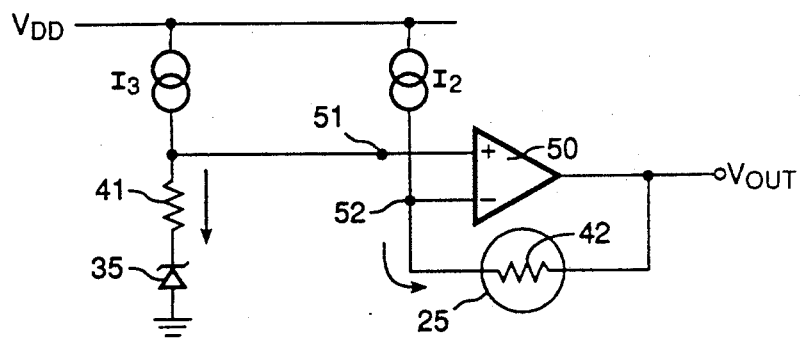
FIG. 8 is a schematic circuit diagram showing the connections between the buried zener diode and the replica device of another embodiment of the invention which uses an operational amplifier.

An alternative embodiment of the circuit of the invention is shown in FIG. 8. In that embodiment, instead of connecting the replica device 25 between the cathode of the zener diode and $V_{out}$, it is connected across operational amplifier 50. In the circuit of FIG. 8, the replica device 25 is connected in the feedback loop of operational amplifier 50. Mathematically, this connection is equivalent to the connection shown in FIG. 7. Since an ideal operational amplifier has infinite gain, the potentials at the two input terminals 51 and 52 are forced to be equal by the feedback of the amplifier. In the circuit of FIG. 8, the voltage on the non-inverting input terminal 51 is established at the zener voltage on the N+ terminal of the zener diode, and is thus the breakdown voltage of the zener diode plus the voltage drop across resistor 41. Because of the feedback in operational amplifier 50, the inverting input 52 of operational amplifier 50 is also at the zener voltage at terminal 51. The output of the amplifier, $V_{out}$, is therefore equal to the voltage at terminal 51 less the voltage drop across replica device 25. Since the resistor 42 of the replica device 25 and resistor 41 of the zener 35 are calculated to achieve the same voltage drop, the output voltage $V_{out}$ will be unaffected by relative changes in the zener on-resistance 41 and the resistance 42 of replica device 25 because these will cancel each other out in the manner discussed above.

The manufacture of the integrated zener diode and replica device of the invention uses conventional MOS techniques, preferably CMOS. These techniques are described in European Patent No. 0,082,331, which is incorporated herein by reference. The only special considerations in the design of the zener and replica devices of this invention not explained in this reference is the need to mask region 24 shown in FIGS. 5 and 6 during the diffusion of N−type impurities to form regions 26 and 28, so that there will be no PN junction within P−type region 24.

As will be apparent to one skilled in the art, the N−type and P−type regions may be reversed to obtain opposite polarity type structures. Moreover, many other variations in the arrangement of the regions of the buried zener diode and replica device and in the process for its manufacture, well within the skill of the art, may be made and still remain within the intended scope of the invention, which should be limited only as set forth in the claims which follow.

I claim:

1. An improved zener diode comprising
   a layer of semiconductor material having a primary surface;
   a zener diode having a PN junction buried beneath said surface;
   a pair of spaced contacts for said diode on said surface, the first located on a first region of said surface and the second located on a second region of said surface laterally spaced from said first region, said contacts establishing a diode current path through said diode across said PN junction;
   a replica device formed in said layer of semiconductor material generally replicating the physical dimensions of said zener diode;
   said replica device having a pair of spaced surface contacts located on spaced regions of said surface with a replica current path between them having substantially the same resistance as the on-resistance of said diode current path, said replica current path replicating said diode current path except that it has no PN junction;
   means coupling said replica device with said diode in a manner such that the voltage across said replica device is subtracted from the voltage across said diode to generate a difference voltage whereby, when current is simultaneously passed through said diode and said replica device, this difference voltage will be substantially independent of changes in the series resistance of said diode current path caused by variations in the manufacturing process and in the ambient temperature at which said diode is being used.

2. The improved zener diode of claim 1 further characterized by said layer of semiconductor material being of one conductivity type and said first region of said surface being of the same conductivity type and of lower resistivity than the underlying semiconductor material, and said second region of said surface being of the opposite conductivity type and forming the PN junction of the diode with the region of said layer of semiconductor material of said one conductivity type below it.

3. The improved zener diode of claim 2 further characterized by the spaced contact regions of said replica device both being of said one conductivity type and of higher resistivity than said underlying layer of semiconductor material.

4. The improved zener diode of claim 3 further characterized by said replica device having a first additional region of said opposite conductivity type laterally surrounding a first of said spaced regions of said replica device, the perimeter of said first additional region being substantially the same as the perimeter of said second spaced contact region of said diode.

5. The improved zener diode of claim 4 further characterized by said replica device having a second additional region of said one conductivity type of lower resistivity than the layer of semiconductor material adjacent to and below both said first spaced contact regions and said first additional region of said replica device, forming a PN junction with said first additional region of said opposite conductivity type but not with said first spaced region of the same conductivity type.

6. The improved zener diode of claim 1 further characterized by said layer of semiconductor material being P conductivity type, said first region of said surface also being P conductivity type and of lower resistivity than said underlying layer of semiconductor material and said second region of said surface being N conductivity type and forming the PN junction of the diode with the region of said layer of semiconductor material of P conductivity type below it.

7. The improved zener diode of claim 6 further characterized by the spaced regions of said replica device both being of P conductivity type and of higher resistivity than the underlying wafer.

8. The improved zener diode of claim 7 further characterized by said replica device having a first additional region of N conductivity type laterally surrounding a first of said spaced regions of said replica device, the perimeter of said first additional region being substantially the same as the perimeter of said second spaced contact region of said diode.

9. The improved zener diode of claim 8 further characterized by said replica device having a second additional region of P conductivity type of lower resistivity than said wafer adjacent to and below both said first spaced contact region and said first additional region, forming a PN junction with said first additional region of said replica device of N conductivity type but not with said first spaced region of P conductivity type.

10. The improved zener diode of claim 1 further characterized by said layer of semiconductor material having two wells therein of one conductivity type, said layer of semiconductor material being of the opposite conductivity type, said diode being formed in a first of said wells and said replica device being formed in the second.

11. The improved zener diode of claim 10 further characterized by said first surface region of said diode being of said one conductivity type and of lower resistivity than said first well, and said second surface region of said diode being of said opposite conductivity type and forming the PN junction of the diode with the region of the first well of said one conductivity type below it.

12. The improved zener diode of claim 11 further characterized by the spaced regions of said replica device both being of said one conductivity type and of lower resistivity than the underlying second well.

13. The improved zener diode of claim 12 further characterized by said replica device having a first additional region of said opposite conductivity type laterally surrounding a first of said spaced contact regions of said replica device, the perimeter of said first additional region being substantially the same as the perimeter of said second spaced contact region of said diode.

14. The improved zener diode of claim 13 further characterized said replica device having a second additional region of said one conductivity type of lower resistivity than said second well adjacent to and below both said first spaced region and said first additional region of said replica device, forming a PN junction with said first additional region of said opposite conductivity type but not with said first spaced region of the same conductivity type.

* * * * *